(12) United States Patent
Park et al.

(10) Patent No.: US 10,923,546 B2
(45) Date of Patent: Feb. 16, 2021

(54) ORGANIC LIGHT-EMITTING DISPLAY DEVICE

(71) Applicant: Samsung Display Co., Ltd., Yongin-si (KR)

(72) Inventors: Hyunae Park, Yongin-si (KR); Dongsoo Kim, Yongin-si (KR); Jieun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/291,306

(22) Filed: Mar. 4, 2019

(65) Prior Publication Data

US 2019/0288046 A1  Sep. 19, 2019

(30) Foreign Application Priority Data

Mar. 19, 2018 (KR) ........................ 10-2018-0031707

(51) Int. Cl.
*H01L 27/32* (2006.01)
*H01L 51/52* (2006.01)

(52) U.S. Cl.
CPC ...... *H01L 27/3258* (2013.01); *H01L 27/3246* (2013.01); *H01L 27/3265* (2013.01); *H01L 27/3276* (2013.01); *H01L 51/5253* (2013.01)

(58) Field of Classification Search
CPC ............ H01L 27/3258; H01L 27/3246; H01L 27/3265; H01L 27/3276; H01L 27/3279; H01L 27/3244; H01L 27/3248; H01L 51/5253; H01L 51/5228; H01L 51/5206; H01L 51/5221

USPC ...... 257/40, 43, 59, 72, 89, 93, 99, E27.111, 257/E33.053, E51.018; 313/498, 506; 315/158; 438/23, 27, 34
See application file for complete search history.

(56) References Cited

U.S. PATENT DOCUMENTS

| | | | |
|---|---|---|---|
| 7,611,965 B2 | 11/2009 | Suzuki et al. | |
| 9,887,241 B2 | 2/2018 | Yamazaki et al. | |
| 10,186,529 B2* | 1/2019 | Noh | H01L 27/1255 |
| 2009/0101904 A1* | 4/2009 | Yamamoto | H01L 27/3258 |
| | | | 257/59 |

(Continued)

FOREIGN PATENT DOCUMENTS

| | | |
|---|---|---|
| JP | 2005031651 | 2/2005 |
| JP | 2013058803 | 3/2013 |

(Continued)

*Primary Examiner* — Dao H Nguyen
(74) *Attorney, Agent, or Firm* — H.C. Park & Associates, PLC

(57) ABSTRACT

An organic light-emitting display device including: a substrate having a display area and a peripheral area outside the display area; a thin-film transistor disposed in the display area, the thin-film transistor including a semiconductor layer, a gate electrode, a source electrode, and a drain electrode; an organic insulating layer configured to cover the thin-film transistor in the display area and including a first opening located in the peripheral area; and a pattern portion disposed on the substrate to correspond to the first opening, the pattern portion including: a first pattern layer and a second pattern layer at least partially overlapping each other, and an inorganic insulating layer disposed between the first pattern layer and the second pattern layer over the display area and the peripheral area.

20 Claims, 8 Drawing Sheets

(56) References Cited

U.S. PATENT DOCUMENTS

| | | | |
|---|---|---|---|
| 2013/0026475 A1* | 1/2013 | Choi | H01L 27/1255 257/59 |
| 2014/0097455 A1* | 4/2014 | Ono | H01L 27/124 257/91 |
| 2016/0111482 A1* | 4/2016 | Cho | H01L 27/3258 257/40 |
| 2016/0233289 A1* | 8/2016 | Son | H01L 27/3258 |
| 2017/0148861 A1* | 5/2017 | Kim | H01L 27/3211 |
| 2017/0237037 A1 | 8/2017 | Choi et al. | |
| 2017/0278912 A1 | 9/2017 | Kim et al. | |
| 2018/0090700 A1* | 3/2018 | Nishinohara | H01J 37/32018 |
| 2019/0189974 A1* | 6/2019 | Gunji | H01L 51/56 |

FOREIGN PATENT DOCUMENTS

| | | |
|---|---|---|
| KR | 10-0786294 | 12/2007 |
| KR | 10-2017-0113763 | 10/2017 |

\* cited by examiner

ORGANIC LIGHT-EMITTING DISPLAY DEVICE

CROSS-REFERENCE TO RELATED APPLICATION

This application claims priority from and the benefit of Korean Patent Application No. 10-2018-0031707, filed on Mar. 19, 2018, which is hereby incorporated by reference for all purposes as if fully set forth herein.

BACKGROUND

Field

Exemplary embodiments/implementations of the invention relate generally to an organic light-emitting display device, and more particularly, to an organic light-emitting display device capable of preventing or reducing degradation of image quality during manufacture or use.

Discussion of the Background

An organic light-emitting display device is a self-luminous display device and includes an organic light-emitting device having a hole-injection electrode, an electron-injection electrode, and an organic light-emitting layer formed therebetween and emits light as excitons generated as holes injected by the hole-injection electrode and electrons injected by the electron-injection electrode combine with each other in the organic light-emitting layer transit from an excited state to a ground state.

Since the organic light-emitting display device is a self-luminous display device and requires no separate light source, the organic light-emitting display device may be driven with a low voltage, may be configured as a lightweight and thin display device. Furthermore, since the organic light-emitting display device is excellent in characteristics such as viewing angle, contrast, and response speed, an application range thereof is expanding.

Quality of an organic light-emitting device in the organic light-emitting display device may deteriorate due to impurities such as gas or moisture generated from an organic material or the like that is introduced from the outside or included in the display device.

The above information disclosed in this Background section is only for understanding of the background of the inventive concepts, and, therefore, it may contain information that does not constitute prior art.

SUMMARY

Devices constructed according to exemplary implementations of the invention are capable of an organic light-emitting display device having a structure capable of preventing or reducing degradation of image quality.

Additional features of the inventive concepts will be set forth in the description which follows, and in part will be apparent from the description, or may be learned by practice of the inventive concepts.

According to one or more implementations/embodiments of the invention, an organic light-emitting display device includes: a substrate having a display area and a peripheral area outside the display area; a thin-film transistor disposed in the display area, the thin-film transistor including a semiconductor layer, a gate electrode, a source electrode, and a drain electrode; an organic insulating layer configured to cover the thin-film transistor in the display area and including a first opening located in the peripheral area; a pixel electrode electrically connected to the thin-film transistor and arranged on the organic insulating layer; a conductive layer disposed on the organic insulating layer and in the first opening in the peripheral area, the conductive layer including the same material as the pixel electrode; and a pattern portion disposed between the substrate and the conductive layer, the pattern portion arranged corresponding to the first opening, wherein the pattern portion includes at least one of a first pattern layer on the same layer as the semiconductor layer, a second pattern layer on the same layer as the gate electrode, and a third pattern layer on the same layer as the source electrode.

The pattern portion may include at least two layers selected from the first pattern layer, the second pattern layer, and the third pattern layer, the at least two layers stacked in the pattern portion, and the organic light-emitting display device may further include an inorganic insulating layer between the at least two layers, the inorganic insulating layer continuously extending to the display area.

The organic light-emitting display device may further include an inorganic insulating layer disposed between the conductive layer and the pattern portion, the inorganic insulating layer continuously extending to the display area.

The organic light-emitting display device may further include: a bank layer disposed on the organic insulating layer, the bank layer extending over the display area and the peripheral area, wherein the bank layer may include: an opening exposing a center portion of the pixel electrode in the display area and a second opening corresponding to the first opening in the peripheral area.

The organic light-emitting display device may further include: a second electrode disposed in a layer different from the gate electrode and the source electrode in the display area, the pattern portion may include at least one of the first pattern layer, the second pattern layer, the third pattern layer, and a fourth pattern layer on the same layer as the second electrode.

The second electrode may overlap the gate electrode to form a storage capacitor.

The organic light-emitting display device may further include: an upper organic insulating layer disposed on the organic insulating layer; and an additional wiring disposed on the upper organic insulating layer.

The upper organic insulating layer in the peripheral area may define an upper opening exposing the first opening.

The organic light-emitting display device may further include: an intermediate layer may including an organic emission layer disposed on the pixel electrode; and an opposite electrode disposed on the intermediate layer, wherein the conductive layer may be electrically connected to the opposite electrode.

The organic light-emitting display device may further include: an encapsulation layer disposed on the display area, wherein the encapsulation layer may include a first inorganic encapsulation layer, an organic encapsulation layer, and a second inorganic encapsulation layer that are sequentially stacked.

According to one or more embodiments, an organic light-emitting display device includes: a substrate having a display area and a peripheral area outside the display area; a thin-film transistor disposed in the display area, the thin-film transistor including a semiconductor layer, a gate electrode, a source electrode, and a drain electrode; an organic insulating layer configured to cover the thin-film transistor in the display area and including a first opening located in the peripheral area; and a pattern portion disposed on the substrate to correspond to the first opening, the pattern portion including: a first pattern layer and a second pattern layer at least partially overlapping each other, and an inorganic insulating layer disposed between the first pattern layer and the second pattern layer over the display area and the peripheral area.

The organic light-emitting display device may further include: a conductive layer disposed on the organic insulating layer and in the first opening; and an upper inorganic insulating layer disposed between the conductive layer and the pattern portion over the display area and the peripheral area.

The organic light-emitting display device may further include: an organic light-emitting device disposed in the display area and electrically connected to the thin-film transistor, the organic light-emitting device including: a pixel electrode, an intermediate layer including an organic emission layer; and an opposite electrode, wherein the conductive layer includes the same material as the pixel electrode and may be electrically connected to the opposite electrode.

The organic light-emitting display device may further include: a bank layer disposed on the organic insulating layer over the display area and the peripheral area, wherein the bank layer may include: an opening exposing a center portion of the pixel electrode in the display area; and a second opening corresponding to the first opening in the peripheral area.

The organic light-emitting display device may further include: a storage capacitor overlapping the thin-film transistor, the storage capacitor including a first electrode and a second electrode, wherein the first electrode of the storage capacitor may be integrally formed with the gate electrode.

The pattern portion may include: a first pattern layer disposed on the same layer as the semiconductor layer; a second pattern layer disposed on the same layer as the gate electrode; a third pattern layer disposed on the same layer as the second electrode; and a fourth pattern layer disposed on the same layer as the drain electrode, and wherein the first, second, third, and fourth pattern layers may be at least partially overlapping each other in the pattern portion.

The organic light-emitting display device may further include: a first gate insulating layer may be disposed between the first pattern layer and the second pattern layer; a second gate insulating layer may be disposed between the second pattern layer and the third pattern layer; and an interlayer insulating layer may be disposed between the third pattern layer and the fourth pattern layer, wherein the first gate insulating layer, the second gate insulating layer, and the interlayer insulating layer may extend to the display area.

The organic light-emitting display device may further include an upper organic insulating layer disposed on the organic insulating layer over the display area and the peripheral area, wherein the upper organic insulating layer may define an upper opening exposing the first opening in the peripheral area.

The organic light-emitting display device may further include an additional wiring disposed on the upper organic insulating layer in the display area, wherein the pattern portion may further include a fifth pattern layer including the same material as the additional wiring.

The organic light-emitting display device may further include an encapsulation layer on the display area, the encapsulation layer including: a first inorganic encapsulation layer; an organic encapsulation layer; and a second inorganic encapsulation layer that are sequentially stacked.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
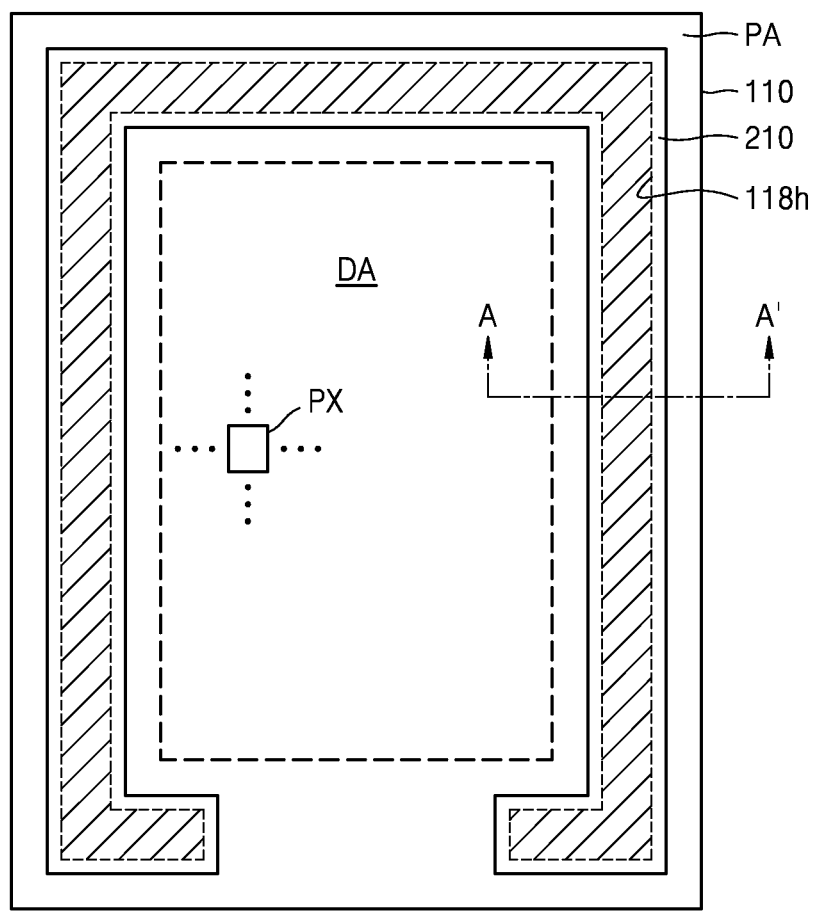
FIG. 1 is a plan view of an organic light-emitting display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
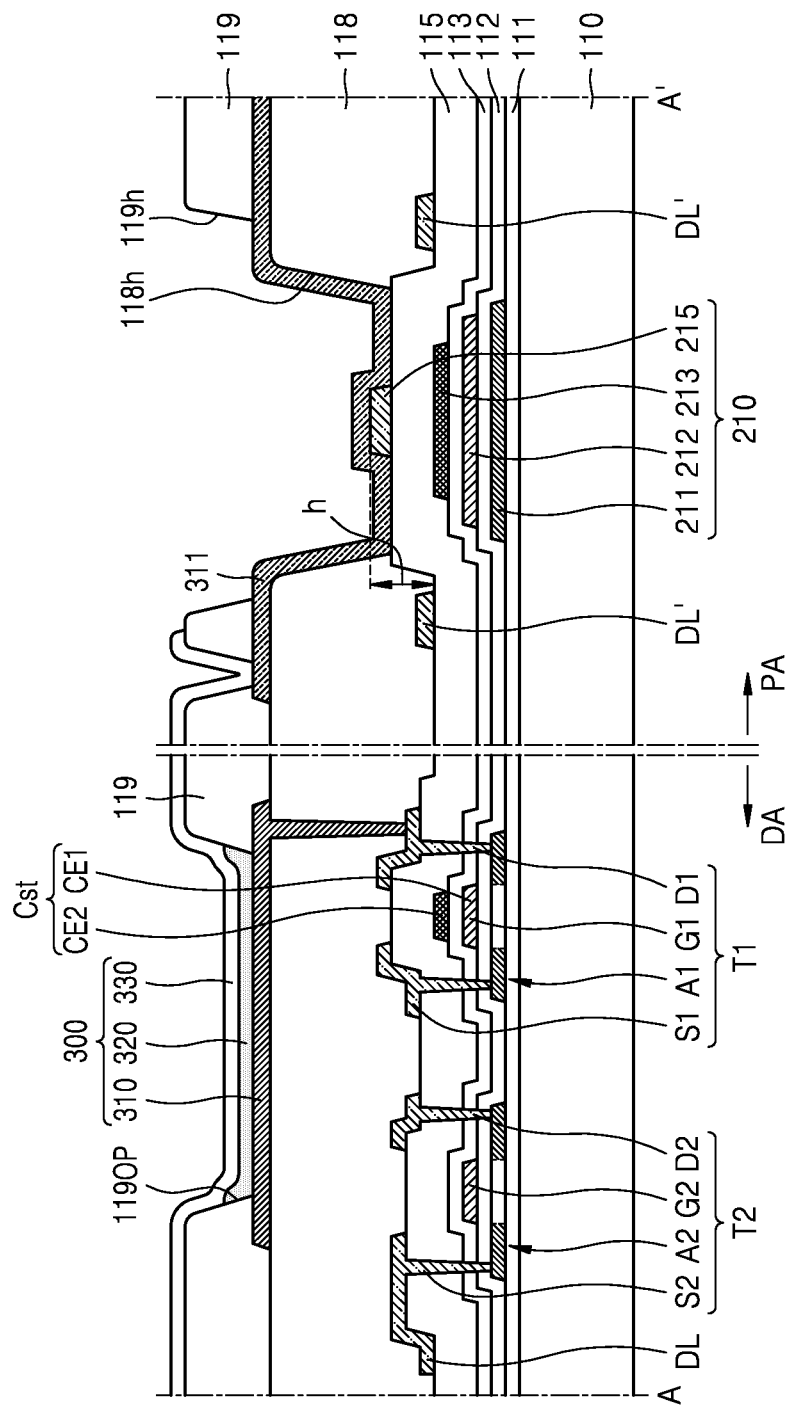
FIG. 2 is a cross-sectional view of the organic light-emitting display device, taken along a sectional line A-A' of FIG. 1.

FIG. 1 is a plan view of an organic light-emitting display device according to an exemplary embodiment, and FIG. 2 is a cross-sectional view of the organic light-emitting display device, taken along a line A-A' of FIG. 1.

Referring to FIGS. 1 and 2, an organic light-emitting display device according to an exemplary embodiment includes a substrate 110 having a display area DA and a peripheral area PA, which is a non-display area outside the display area DA.

Pixels PX including an organic light-emitting device (OLED) may be arranged in the display area DA of the substrate 110. The pixels PX may further include a plurality of thin-film transistors (TFTs) T1 and T2 and a storage capacitor Cst for controlling the OLED. The numbers of the first and second TFTs T1 and T2 included in one pixel may be variously changed from two to seven.

Various wirings for transmitting an electrical signal to be applied to the display area DA may be located in a peripheral area PA of the substrate 110. A TFT may be in the peripheral area PA. The TFT in the peripheral area PA may be a portion of a circuit unit for controlling an electrical signal applied in the display area DA.

In the present embodiment, a first opening 118h defined in an organic insulating layer 118 is in the peripheral area PA so as to surround at least a portion of the display area DA, and a pattern portion 210 is arranged to correspond to the first opening 118h. That is, the pattern portion 210 is disposed to overlap the first opening 118h.

FIG. 1 shows that the first opening 118h surrounds the left side, the right side, the upper side, and at least a part of the lower side of the display area DA in a plan view. However, the present embodiment is not limited thereto. For example, the first opening 118h may be variously formed such that the first opening 118h is arranged to completely surround the display area DA.

Hereinafter, with reference to FIG. 2, components included in the organic light-emitting display device according to an exemplary embodiment of the disclosure will be described in more detail.

The substrate 110 may be formed of various materials such as a glass material, a metal material, a plastic material, or the like. For example, the substrate 110, which may be a flexible substrate, may include a high-molecular resin such as polyethersulphone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

A buffer layer 111 is disposed on the substrate 110 to reduce or block the penetration of foreign materials, moisture, or external air from a lower side of the substrate 110 and may provide a flat surface on the substrate 110. The buffer layer 111 may include an inorganic material, such as an oxide or nitride, an organic material, or an organic-inorganic composite material, and may have a single layer structure or a multilayer structure including an inorganic material or an organic material. A barrier layer may be further between the substrate 110 and the buffer layer 111 to block or reduce penetration of outside air.

The first TFT T1 includes a semiconductor layer A1, a gate electrode G1, a source electrode S1, and a drain electrode D1, and the second TFT T2 includes a semiconductor layer A2, a gate electrode G2, a source electrode S2, and a drain electrode D2. The first TFT T1 may serve as a driving TFT connected to an OLED 300 to drive the OLED 300. The second TFT T2 may be connected to a data line DL to serve as a switching TFT. Although two TFTs are shown in drawings, they are not limited thereto. The numbers of TFTs may be variously changed from two to seven.

The semiconductor layers A1 and A2 may include amorphous silicon or polycrystalline silicon. In another exemplary embodiment, the semiconductor layers A1 and A2 may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). Each of the semiconductor layers A1 and A2 may include a channel region, and source and drain regions that are doped with impurities.

The gate electrodes G1 and G2 are on the semiconductor layers A1 and A2 and with a first gate insulating layer 112 therebetween. Each of the gate electrodes G1 and G2 includes molybdenum (Mo), aluminum (Al), copper (Cu), or Ti and may be formed as a single layer or a multilayer. For example, each of the gate electrodes G1 and G2 may be a single layer of Mo.

The first gate insulating layer 112 may include silicon oxide ($SiO_2$), silicon nitride (SiN), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$).

A second gate insulating layer 113 may be provided to cover the gate electrodes G1 and G2. The second gate insulating layer 113 may include $SiO_2$, SiNx, SiON, $Al_2O_3$, $TiO_2$, $Ta_2O_5$, $HfO_2$, or $ZrO_2$.

A first electrode CE1 of the storage capacitor Cst may overlap the first TFT T1. In other words, the gate electrode G1 of the first TFT T1 may serve as the first electrode CE1 of the storage capacitor Cst.

A second electrode CE2 of the storage capacitor Cst overlaps the first electrode CE1 with the second gate insulating layer 113 therebetween. Here, the second gate insulating layer 113 may serve as a dielectric layer of the storage capacitor Cst. The second electrode CE2 may include Mo, Al, Cu, or Ti and may be formed as a single layer or a multilayer including the above materials. For example, the second electrode CE2 may be a single layer of Mo or a multilayer of Mo/Al/Mo.

The source electrodes S1 and S2 and the drain electrodes D1 and D2 are arranged on an interlayer insulating layer 115. Each of the source electrodes S1 and S2 and the drain electrodes D1 and D2 may include Mo, Al, Cu, or Ti and may be formed as a single layer or a multilayer including the above materials. For example, each of the source electrodes S1 and S2 and the drain electrodes D1 and D2 may have a multilayer structure of Ti/Al/Ti.

The peripheral area PA may be provided with a wiring DL' on the same layer as the source electrodes S1 and S2 and the drain electrodes D1 and D2. The wiring DL' may be electrically connected to the data line DL or the first and second TFTs T1 and T2 of the display area DA by a wiring for transmitting a data signal, a gate signal, or a driving voltage.

The organic insulating layer 118 may be disposed on the source electrodes S1 and S2 and the drain electrodes D1 and D2 and the OLED 300 may be disposed on the organic insulating layer 118.

The organic insulating layer 118 may have a substantially flat top surface so that a pixel electrode 310 may be formed flat. The organic insulating layer 118 may include organic materials and may be formed as a single layer or a multilayer. The organic materials may include a general polymer such as benzocyclobutene (BCB), PI, hexamethyldisiloxane (HMDSO), polymethylmethacrylate (PMMA), and polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof.

The organic insulating layer 118 is disposed on the substrate 110 over the display area DA and the peripheral area PA outside the display area DA and may have the first opening 118h exposing the interlayer insulating layer 115 in the peripheral area PA. This is to prevent or reduce impurities or the like penetrating from the outside from reaching the inside of the display area DA through an organic material of the organic insulating layer 118.

In the display area DA of the substrate 110, the OLED 300 is disposed on the organic insulating layer 118. The OLED 300 includes the pixel electrode 310, an intermediate layer 320 including an organic light-emitting layer, and an opposite electrode 330.

The organic insulating layer 118 has an opening exposing any one of a source electrode S1 and a drain electrode D1 of the first TFT T1, and the pixel electrode 310 contacts the source electrode S1 or the drain electrode D1 through the opening and is electrically connected to the first TFT T1.

The pixel electrode 310 may be a transparent electrode or a reflective electrode. According to exemplary embodiments, the pixel electrode 310 may include a reflective film formed of silver (Ag), magnesium (Mg), aluminum (Al), platinum (Pt), palladium (Pd), gold (Au), nickel (Ni), neodymium (Nd), iridium (Jr), chromium (Cr), or a compound thereof, and a transparent or semi-transparent electrode layer formed on the reflective film. The transparent or semi-transparent electrode layer may include indium tin oxide (ITO), indium zinc oxide (IZO), zinc oxide (ZnO), indium oxide ($In_2O_3$), indium gallium oxide (IGO), or aluminum zinc oxide (AZO).

A bank layer 119 may be disposed on the organic insulating layer 118 over the display area DA and the peripheral area PA. The bank layer 119 may define a light-emitting area of a sub-pixel by having an opening 119OP exposing at least a central portion of the pixel electrode 310 corresponding to each of sub-pixels in the display area DA. Furthermore, the bank layer 119 may prevent generation of an arc on edges of the pixel electrode 310 by increasing a distance between edges of the pixel electrode 310 and the opposite electrode 330 above the pixel electrode 310. The bank layer 119 may include at least one organic insulating material of PI, polyamide, acrylic resin, BCB, and phenolic resin, and may be formed by spin coating.

Meanwhile, the bank layer 119 may be in the peripheral area PA. The bank layer 119 may have a second opening 119*h* exposing the first opening 118*h* of the organic insulating layer 118 in the peripheral area PA. That is, a width of the second opening 119*h* may be greater than that of the first opening 118*h*, and the first opening 118*h* may be inside the second opening 119*h*. In some embodiments, the bank layer 119 may be separated with the first opening 118*h* therebetween.

Since the bank layer 119 has the second opening 119*h* in the peripheral area PA, it is possible to prevent or reduce inflow of impurities or the like penetrating from the outside through the bank layer 119. Thus, it is possible to prevent or reduce deterioration of image quality realized in the organic light-emitting display device.

The intermediate layer 320 of the OLED 300 may include an organic emission layer. The organic emission layer may include an organic material including a fluorescent or phosphorescent material that emits red, green, blue, or white light. The organic emission layer may include a low-molecular weight organic material or a high-molecular weight organic material. A functional layer such as a hole transport layer (HTL), a hole injection layer (HIL), an electron transport layer (ETL), or an electron injection layer (EIL) may selectively be further arranged on and under the organic emission layer. The intermediate layer 320 may be arranged corresponding to each of a plurality of pixel electrodes 310. However, the exemplary embodiments are not limited thereto. The intermediate layer 320 may include a layer that is integral with the plurality of pixel electrodes 310 and various modifications may be made.

The opposite electrode 330 may be a transparent electrode or a reflective electrode. In some embodiments, the opposite electrode 330 may be a transparent electrode or semi-transparent electrode, and may include a metal thin-film, which has a small work function, including Li, Ca, lithium fluoride (LiF)/Ca, LiF/Al, Al, Ag, Mg or a compound thereof. Furthermore, a transparent conductive oxide (TCO) layer including such as ITO, IZO, ZnO, or $In_2O_3$ may further be arranged on the metal thin-film. The opposite electrode 330 may be arranged over the display area DA and the peripheral area PA and may be disposed on the intermediate layer 320 and the bank layer 119. The opposite electrode 330 may be formed integrally with a plurality of OLEDs 300 to correspond to the plurality of pixel electrodes 310.

As described above, the organic insulating layer 118 and the bank layer 119 are disposed on the substrate 110 over the display area DA and the peripheral area PA, and the organic insulating layer 118 includes the first opening 118*h* in the peripheral area PA. In addition, the bank layer 119 may include the second opening 119*h* exposing the first opening 118*h*. That is, an organic material constituting the bank layer 119 may not be in the first opening 118*h*.

A conductive layer 311 may be disposed on the organic insulating layer 118 arranged in the peripheral area PA and in the first opening 118*h*. The conductive layer 311 may be disposed on the same layer as the pixel electrode 310 and at least a portion of the conductive layer 311 may be disposed between the organic insulating layer 118 and the bank layer 119. The conductive layer 311 may include the same material as the pixel electrode 310 and completely cover the first opening 118*h*. One end of the conductive layer 311 contacts the opposite electrode 330 and may serve as a wiring for transmitting a common voltage to the opposite electrode 330.

Meanwhile, the pattern portion 210 is arranged to correspond to the first opening 118*h* of the organic insulating layer 118. The pattern portion 210 may include at least one of a first pattern layer 211 including the same material and disposed on the same layer as the semiconductor layers A1 and A2, a second pattern layer 212 including the same material and disposed on the same layer as the gate electrodes G1 and G2, a third pattern layer 213 including the same material and disposed on the same layer as the second electrode CE2, and a fourth pattern layer 215 including the same material and disposed on the same layer as the drain electrodes D1 and D2.

Although FIG. 2 shows that the pattern portion 210 includes all of the first pattern layer 211, the second pattern layer 212, the third pattern layer 213, and the fourth pattern layer 215, the exemplary embodiments are not limited thereto.

According to the exemplary embodiments, the first pattern layer 211, the second pattern layer 212, the third pattern layer 213, and the fourth pattern layer 215 are arranged to correspond to the first opening 118*h*. Therefore, the first pattern layer 211, the second pattern layer 212, the third pattern layer 213, and the fourth pattern layer 215 may be stacked and arranged at least partially overlapping each other. Although FIG. 2 shows that widths of the second pattern layer 212, the third pattern layer 213, and the fourth pattern layer 215 are less than a width of the first opening 118*h*, and the second pattern layer 212, the third pattern layer 213, and the fourth pattern layer 215 are arranged to correspond to the inside of the first opening 118*h*, the exemplary embodiments are not limited thereto.

For example, the widths of the second pattern layer 212, the third pattern layer 213, and the fourth pattern layer 215 may be similar to the width of the first opening 118*h* as in the first pattern layer 211, or the widths of the second pattern layer 212, the third pattern layer 213, and the fourth pattern layer 215 may be greater than the width of the first opening 118*h*, and various modifications may be made. Also, the width of the first pattern layer 211 may be modified to be greater or less than the width of the first opening 118*h*.

The first pattern layer 211 may be disposed on the buffer layer 111, and the first gate insulating layer 112 may be disposed between the first pattern layer 211 and the second pattern layer 212, the second gate insulating layer 113 may be disposed between the second pattern layer 212 and the third pattern layer 213, and the interlayer insulating layer 115 may be disposed between the third pattern layer 213 and the fourth pattern layer 215. The buffer layer 111, the first gate insulating layer 112, the second gate insulating layer 113, and the interlayer insulating layer 115 may be continuously arranged on the substrate 110 from the display area DA to the peripheral area PA.

The buffer layer 111, the first gate insulating layer 112, the second gate insulating layer 113, and the interlayer insulating layer 115 may be referred to as an inorganic insulating layer and include an inorganic material, so that external impurities may be blocked or reduced from penetrating there through. A height h of the pattern portion 210 in the first opening 118h may be increased due to thicknesses of the buffer layer 111, the first gate insulating layer 112, the second gate insulating layer 113, and the interlayer insulating layer 115.

According to the exemplary embodiments, the height h of the pattern portion 210 from a bottom surface of the organic insulating layer 118 may be from several to several tens of μm. For example, the height h of the pattern portion 210 may be about 10 μm to 15 μm.

In forming the organic insulating layer 118, the bank layer 119, and the pattern portion 210 may be provided to remove or reduce organic materials from the first opening 118h of the organic insulating layer 118 and the second opening 119h of the bank layer 119.

The organic insulating layer 118 may be formed by applying an organic material to the entire surface of the substrate 110 and exposing and developing an area corresponding to the first opening 118h. Here, if a thickness of the organic insulating layer 118 is increased, the organic material in the area corresponding to the first opening 118h may not be completely removed and residue of the organic material may remain.

Likewise, in a state in which the organic insulating layer 118 having the first opening 118h is formed, the bank layer 119 may be formed by applying an organic material to the entire surface of the substrate 110 and exposing and developing an area corresponding to the second opening 119h. In this case, the organic material forming the bank layer 119 is arranged inside the first opening 118h. Therefore, as a depth of the first opening 118h increases, the organic material forming the bank layer 119 may not be completely removed and residue of the organic material may remain.

In the present embodiment, since the pattern portion 210 protrudes so as to correspond to the first opening 118h, the organic material may be completely removed when the first opening 118h and the second opening 119h are formed, thereby preventing or reducing residual organic material overlapping with the first opening 118h and the second opening 119h, which may cause defects.

If an organic material exists in the first opening 118h and/or the second opening 119h, external impurities may penetrate the display area DA through the residue organic material. However, the present embodiment provides the pattern portion 210 so that an organic material forming the organic insulating layer 118 and the bank layer 119 is not in the first opening 118h, and thus, external impurities may be prevented from penetrating into the display area DA. Thus, deterioration of the OLED 300 may be prevented.

Figure 3:
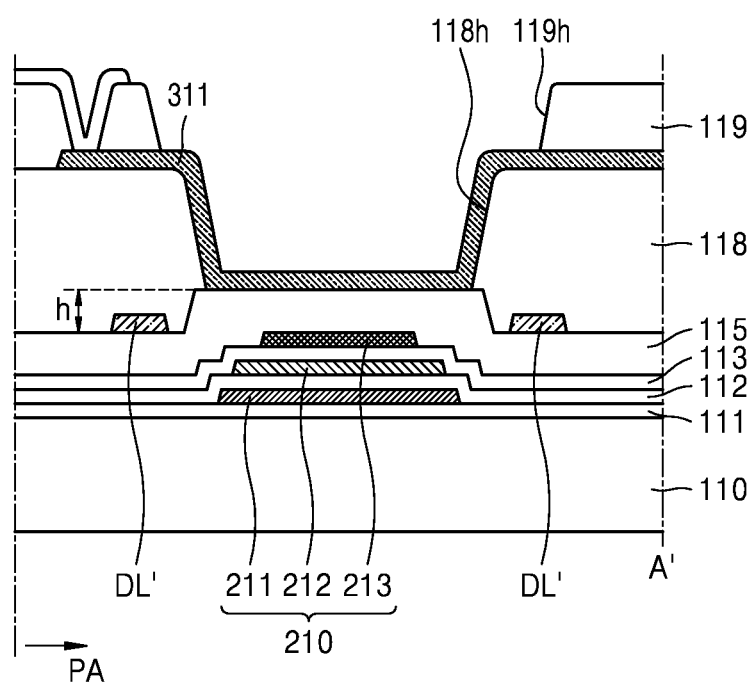
FIG. 3 is a cross-sectional view of a portion of an organic light-emitting display device according to an exemplary embodiment.

FIG. 3 is a cross-sectional view of a portion of an organic light-emitting display device according to an exemplary embodiment. In more detail, FIG. 3 mainly shows a region where the first opening 118h is arranged. In FIG. 3, the same reference numerals in FIG. 2 denote the same elements, and a duplicate description will be omitted for simplicity.

Referring to FIG. 3, the organic light-emitting display device includes the organic insulating layer 118 having the first opening 118h in the peripheral area PA and further includes the pattern portion 210 to correspond to the first opening 118h. Furthermore, the organic light-emitting display device may have the conductive layer 311, which may include the same material as the pixel electrode 310, disposed on the organic insulating layer 118 and in the first opening 118h in the peripheral area. In addition, the organic light-emitting display device may have the bank layer 119 including the second opening 119h exposing the first opening 118h.

The pattern portion 210 may include at least one of the first pattern layer 211 including the same material and disposed on the same layer as the semiconductor layers A1 and A2 (see FIG. 2), the second pattern layer 212 including the same material and disposed on the same layer as the gate electrodes G1 and G2 (see FIG. 2), the third pattern layer 213 including the same material and disposed on the same layer as the second electrode CE2 (see FIG. 2), and the fourth pattern layer 215 including the same material and disposed on the same layer as the drain electrodes D1 and D2 (see FIG. 2).

The pattern portion 210 may include at least three layers selected from the first pattern layer 211, the second pattern layer 212, the third pattern layer 213, and the fourth pattern layer 215.

Although FIG. 3 shows that the pattern portion 210 includes the first pattern layer 211, the second pattern layer 212, and the third pattern layer 213, the exemplary embodiments are not limited thereto. For example, the pattern portion 210 may include the second pattern layer 212, the third pattern layer 213, and the fourth pattern layer 215 or may include the first pattern layer 211, the third pattern layer 213, and the fourth pattern layer 215. The pattern portion 210 may also include the first pattern layer 211, the second pattern layer 212, and the fourth pattern layer 215.

When the pattern portion 210 includes the first pattern layer 211, the second pattern layer 212, and the third pattern layer 213, the interlayer insulating layer 115 is disposed on the third pattern layer 213, that is, between the third pattern layer 213 and the conductive layer 311. The conductive layer 311 may directly contact the interlayer insulating layer 115.

Meanwhile, the first pattern layer 211 may be disposed on the buffer layer 111, the first gate insulating layer 112 may be disposed between the first pattern layer 211 and the second pattern layer 212, and the second gate insulating layer 113 may be disposed between the second pattern layer 212 and the third pattern layer 213. The buffer layer 111, the first gate insulating layer 112, the second gate insulating layer 113, and the interlayer insulating layer 115 may be continuously arranged on the substrate 110 from the display area DA to the peripheral area PA.

The buffer layer 111, the first gate insulating layer 112, the second gate insulating layer 113, and the interlayer insulating layer 115 include an inorganic material, so that external impurities are not penetrated thereto. The height h of the pattern portion 210 in the first opening 118h may be increased due to thicknesses of the buffer layer 111, the first gate insulating layer 112, the second gate insulating layer 113, and the interlayer insulating layer 115.

The first opening 118h is defined in the organic insulating layer 118 to separate at least a portion of the organic insulating layer 118 from the peripheral area PA so that external impurities may be prevented from penetrating through the organic material of the organic insulating layer 118.

In addition, the pattern portion 210 may be arranged and form a step to correspond to the first opening 118h. Accordingly, all organic materials may be removed when the first opening 118*h* is formed, thereby preventing or reducing residual organic material overlapping the first opening 118*h*, which may cause defects.

Figure 4:
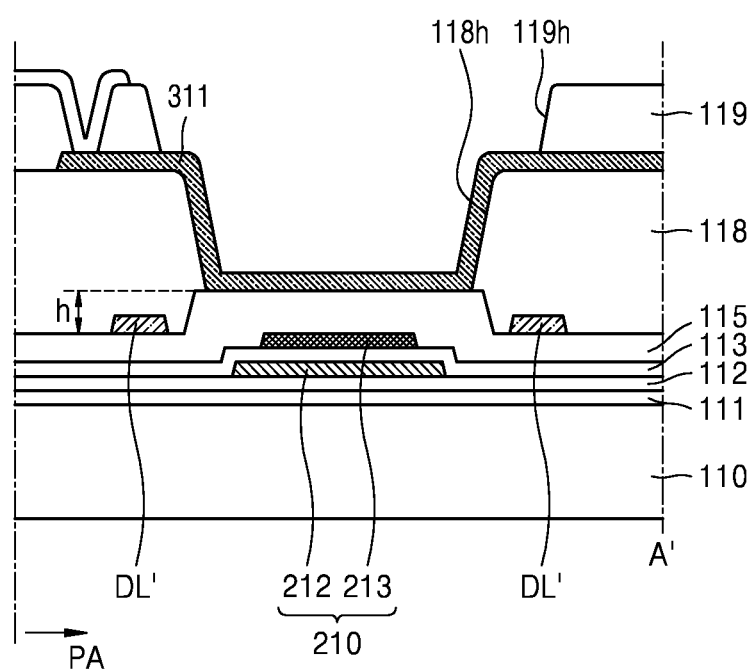
FIG. 4 is a cross-sectional view of a portion of an organic light-emitting display device according to an exemplary embodiment.

FIG. 4 is a cross-sectional view of a portion of an organic light-emitting display device according to an exemplary embodiment. In more detail, FIG. 4 mainly shows a region where the first opening 118*h* is arranged. In FIG. 4, the same reference numerals in FIG. 2 denote the same elements, and a duplicate description will be omitted for simplicity.

Referring to FIG. 4, the organic light-emitting display device includes the organic insulating layer 118 having the first opening 118*h* in the peripheral area PA and further includes the pattern portion 210 to correspond to the first opening 118*h*. Furthermore, the organic light-emitting display device may have the conductive layer 311, which may include the same material as the pixel electrode 310, on the organic insulating layer 118 and in the first opening 118*h* in the peripheral area. In addition, the organic light-emitting display device may have the bank layer 119 including the second opening 119*h* exposing the first opening 118*h*.

The pattern portion 210 may include at least one of the first pattern layer 211 including the same material and disposed on the same layer as the semiconductor layers A1 and A2 (see FIG. 2), the second pattern layer 212 including the same material and disposed on the same layer as the gate electrodes G1 and G2 (see FIG. 2), the third pattern layer 213 including the same material and disposed on the same layer as the second electrode CE2 (see FIG. 2), and the fourth pattern layer 215 including the same material and disposed on the same layer as the drain electrodes D1 and D2 (see FIG. 2).

The pattern portion 210 may include at least two of the first pattern layer 211, the second pattern layer 212, the third pattern layer 213, and the fourth pattern layer 215.

Although FIG. 4 shows that the pattern portion 210 includes the second pattern layer 212 and the third pattern layer 213, the exemplary embodiments are not limited thereto. For example, the pattern portion 210 may include the first pattern layer 211 and the second pattern layer 212 or may include the first pattern layer 211 and the third pattern layer 213. Furthermore, the pattern portion 210 may include the first pattern layer 211 and the fourth pattern layer 215, may include the second pattern layer 212 and the fourth pattern layer 215, or may include the third pattern layer 213 and the fourth pattern layer 215.

When the pattern portion 210 includes the second pattern layer 212 and the third pattern layer 213, the interlayer insulating layer 115 is disposed on the third pattern layer 213, that is, between the third pattern layer 213 and the conductive layer 311. The conductive layer 311 may directly contact the interlayer insulating layer 115.

Meanwhile, the second pattern layer 212 may be disposed on the first gate insulating layer 112, and the second gate insulating layer 113 may be disposed between the second pattern layer 212 and the third pattern layer 213. The buffer layer 111, the first gate insulating layer 112, the second gate insulating layer 113, and the interlayer insulating layer 115 may be continuously arranged on the substrate 110 from the display area DA to the peripheral area PA. The buffer layer 111, the first gate insulating layer 112, the second gate insulating layer 113, and the interlayer insulating layer 115 include an inorganic material, so that external impurities are not penetrated thereto. The height h of the pattern portion 210 in the first opening 118*h* may be increased due to thicknesses of the buffer layer 111, the first gate insulating layer 112, the second gate insulating layer 113, and the interlayer insulating layer 115.

The first opening 118*h* is defined in the organic insulating layer 118 to separate at least a portion of the organic insulating layer 118 from the peripheral area PA so that external impurities may be prevented from penetrating through the organic material of the organic insulating layer 118.

In addition, the pattern portion 210 may be arranged and form a step to correspond to the first opening 118*h*. Accordingly, all organic materials may be removed when the first opening 118*h* is formed, thereby preventing or reducing residual original material overlapping the first opening 118*h*.

Figure 5:
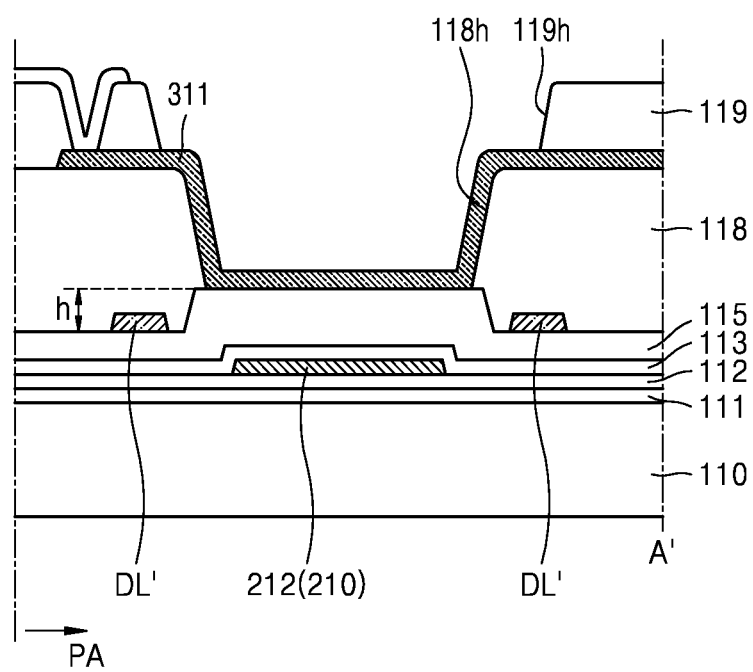
FIG. 5 is a cross-sectional view of a portion of an organic light-emitting display device according to an exemplary embodiment.

FIG. 5 is a cross-sectional view of a portion of an organic light-emitting display device according to an exemplary embodiment. In more detail, FIG. 5 mainly shows a region where the first opening 118*h* is arranged. In FIG. 5, the same reference numerals in FIG. 2 denote the same elements, and a duplicate description will be omitted for simplicity.

Referring to FIG. 5, the organic light-emitting display device includes the organic insulating layer 118 having the first opening 118*h* in the peripheral area PA and further includes the pattern portion 210 to correspond to the first opening 118*h*. Furthermore, the organic light-emitting display device may have the conductive layer 311, which may include the same material as the pixel electrode 310, on the organic insulating layer 118 and in the first opening 118*h* in the peripheral area. In addition, the organic light-emitting display device may have the bank layer 119 including the second opening 119*h* exposing the first opening 118*h*.

The pattern portion 210 may include at least one of the first pattern layer 211 including the same material and disposed on the same layer as the semiconductor layers A1 and A2 (see FIG. 2), the second pattern layer 212 including the same material and disposed on the same layer as the gate electrodes G1 and G2 (see FIG. 2), the third pattern layer 213 including the same material and disposed on the same layer as the second electrode CE2 (see FIG. 2), and the fourth pattern layer 215 including the same material and disposed on the same layer as the drain electrodes D1 and D2 (see FIG. 2).

The pattern portion 210 may include at least one of the first pattern layer 211, the second pattern layer 212, the third pattern layer 213, and the fourth pattern layer 215.

Although FIG. 5 shows that the pattern portion 210 includes the second pattern layer 212, the exemplary embodiments are not limited thereto. For example, the pattern portion 210 may include the first pattern layer 211, the third pattern layer 213, or the fourth pattern layer 215.

When the pattern portion 210 includes the second pattern layer 212, the second gate insulating layer 113 and the interlayer insulating layer 115 are on the second pattern layer 212, that is, between the second pattern layer 212 and the conductive layer 311. The conductive layer 311 may directly contact the interlayer insulating layer 115.

Meanwhile, the second pattern layer 212 may be disposed on the first gate insulating layer 112. The buffer layer 111, the first gate insulating layer 112, the second gate insulating layer 113, and the interlayer insulating layer 115 may be continuously arranged on the substrate 110 from the display area DA to the peripheral area PA. The buffer layer 111, the first gate insulating layer 112, the second gate insulating layer 113, and the interlayer insulating layer 115 include an inorganic material, so that external impurities may be blocked or reduced from penetrating there through. The height h of the pattern portion 210 in the first opening 118*h* may be increased due to thicknesses of the buffer layer 111, the first gate insulating layer 112, the second gate insulating layer 113, and the interlayer insulating layer 115.

The first opening 118h is defined in the organic insulating layer 118 to separate at least a portion of the organic insulating layer 118 from the peripheral area PA so that external impurities may be prevented from penetrating through the organic material of the organic insulating layer 118.

In addition, the pattern portion 210 may be arranged and form a step to correspond to the first opening 118h. Accordingly, all organic materials may be removed when the first opening 118h is formed, thereby preventing or reducing residual organic material overlapping the first opening, which may cause defects.

As shown in FIGS. 3, 4, and 5, the pattern portion 210 according to the present embodiments may vary, and structures included in the pattern portion 210 may vary depending on the thickness of the organic insulating layer 118.

Figure 6:
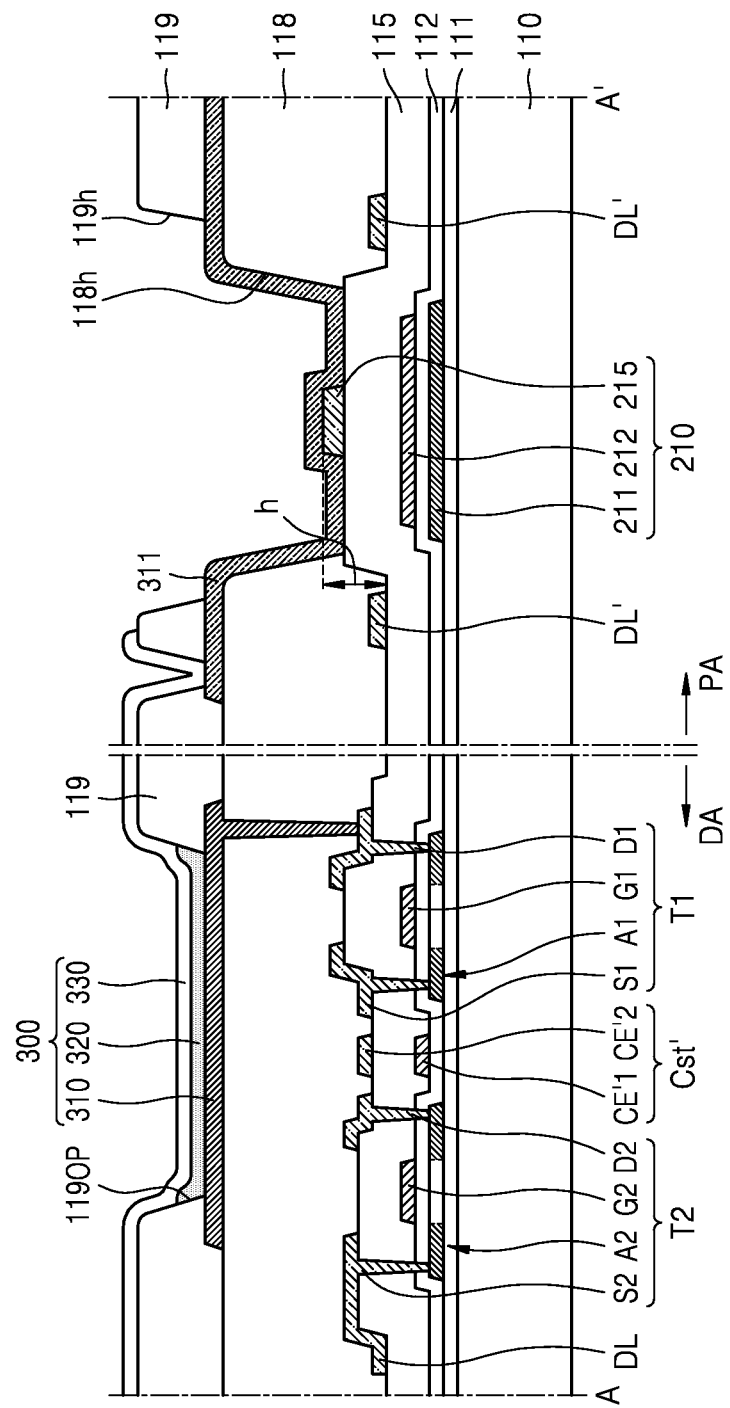
FIG. 6 is a cross-sectional view of a portion of an organic light-emitting display device according to an exemplary embodiment.

FIG. 6 is a cross-sectional view of a portion of an organic light-emitting display device according to an exemplary embodiment. In FIG. 6, the same reference numerals in FIG. 2 denote the same elements, and a duplicate description will be omitted for simplicity.

In the organic light-emitting display device of FIG. 6, the storage capacitor Cst may be arranged not overlapping the first TFT T1. In this case, the second gate insulating layer 113 (see FIG. 2) may be omitted.

The first electrode CE1 of the storage capacitor Cst may include the same material and be disposed on the same layer as the gate electrodes G1 and G2, the second electrode CE2 may include the same material and be disposed on the same layer as the source electrodes S1 and S2 and the drain electrodes D1 and D2, and the interlayer insulating layer 115 may serve as a dielectric.

Also, the organic light-emitting display device of FIG. 6 includes the organic insulating layer 118 having the first opening 118h in the peripheral area PA and further includes the pattern portion 210 to correspond to the first opening 118h. Furthermore, the organic light-emitting display device may have the conductive layer 311, which may include the same material as the pixel electrode 310, on the organic insulating layer 118 and in the first opening 118h in the peripheral area. In addition, the organic light-emitting display device may have the bank layer 119 including the second opening 119h exposing the first opening 118h.

The pattern portion 210 may include at least one of the first pattern layer 211 including the same material and disposed on the same layer as the semiconductor layers A1 and A2, the second pattern layer 212 including the same material and disposed on the same layer as the gate electrodes G1 and G2, and the fourth pattern layer 215 including the same material and disposed on the same layer as the drain electrodes D1 and D2.

Although FIG. 6 shows that the pattern portion 210 includes all of the first pattern layer 211, the second pattern layer 212, and the fourth pattern layer 215, the exemplary embodiments are not limited thereto. The pattern portion 210 may include only one of the first pattern layer 211, the second pattern layer 212, and the fourth pattern layer 215, or may include only two of the first pattern layer 211, the second pattern layer 212, and the fourth pattern layer 215.

Figure 7:
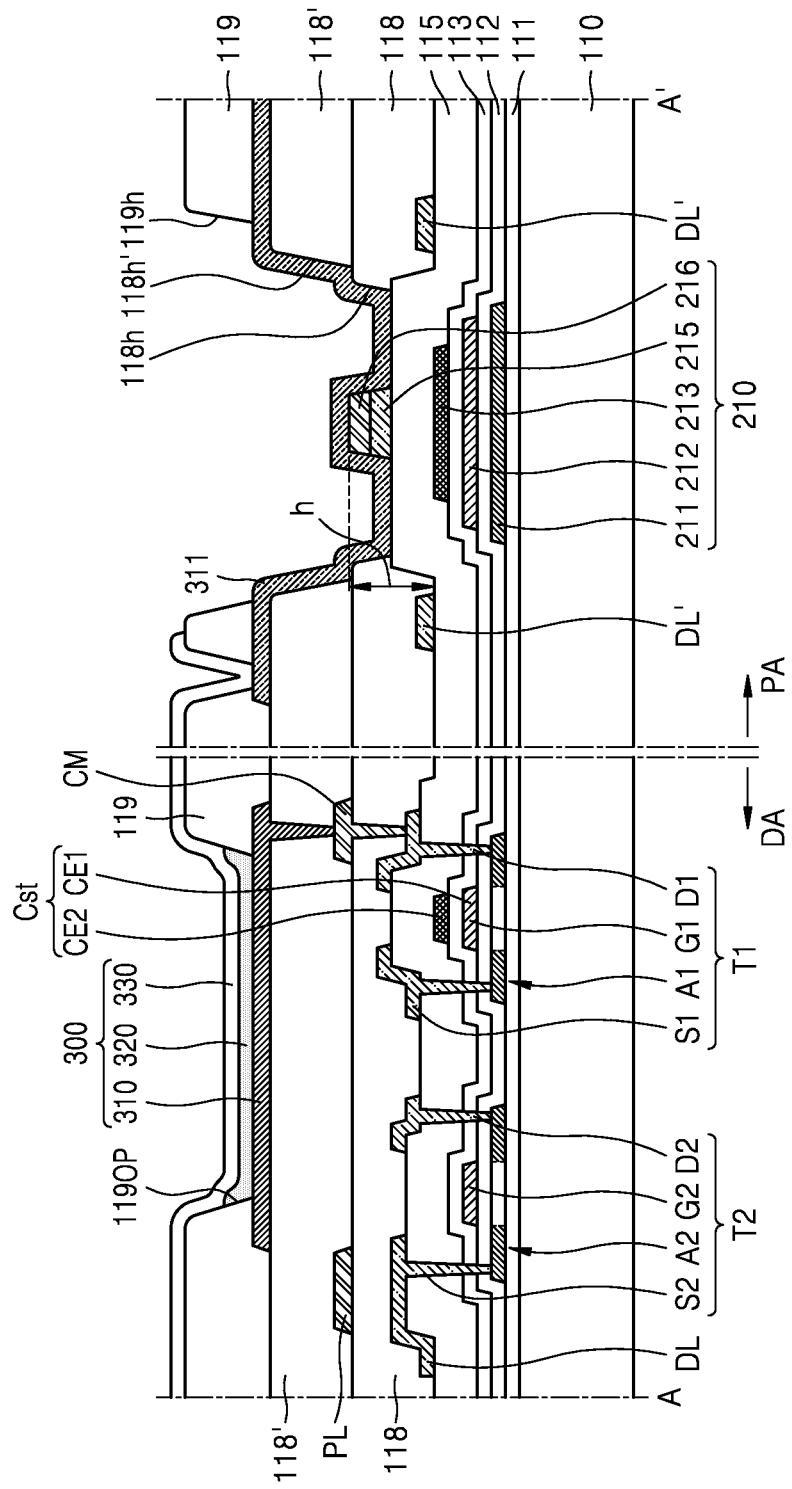
FIG. 7 is a cross-sectional view of a portion of an organic light-emitting display device according to an exemplary embodiment.

FIG. 7 is a cross-sectional view of a portion of an organic light-emitting display device according to an exemplary embodiment. In FIG. 7, the same reference numerals in FIG. 2 denote the same elements, and a duplicate description will be omitted for simplicity.

Referring to FIG. 7, the organic light-emitting display device may further include an upper organic insulating layer 118' disposed on the organic insulating layer 118. Furthermore, the upper organic insulating layer 118' may further include an additional wiring PL and a connection wiring CM.

The upper organic insulating layer 118' is disposed on the substrate 110 over the display area DA and the peripheral area PA outside the display area DA and may include an upper opening 118h' exposing the first opening 118h defined in the organic insulating layer 118 in the peripheral area PA. This is to prevent or reduce impurities or the like penetrating from the outside from reaching the inside of the display area DA through an organic material of the upper organic insulating layer 118'.

The upper organic insulating layer 118' may include a general polymer such as BCB, PI, HMDSO, PMMA, and PS, a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof. The upper organic insulating layer 118' may be a single layer or a multilayer.

The additional wiring PL on the organic insulating layer 118 may serve as a driving voltage line for transmitting a driving voltage or a data line for transmitting a data signal. The additional wiring PL may be connected to the data line DL through a contact hole defined in the organic insulating layer 118. The pixel electrode 310 of the OLED and the first TFT T1 may be connected to each other through the connection wiring CM on the organic insulating layer 118. The additional wiring PL and the connection wiring CM include Mo, Al, Cu, Ti, and the like and may be formed as a single layer or a multilayer.

The conductive layer 311 may be arranged on the upper organic insulating layer 118' in the peripheral area PA, and in the upper opening 118h' and the first opening 118h. The conductive layer 311 may be disposed on the same layer as the pixel electrode 310 and at least a portion of the conductive layer 311 may be disposed between the organic insulating layer 118 and the bank layer 119. The conductive layer 311 may include the same material as the pixel electrode 310 and completely cover the upper opening 118h' and the first opening 118h. One end of the conductive layer 311 contacts the opposite electrode 330 and may serve as a wiring for transmitting a common voltage to the opposite electrode 330.

Meanwhile, the pattern portion 210 is arranged to correspond to the upper opening 118h' and the first opening 118h. The pattern portion 210 may include at least one of the first pattern layer 211 including the same material and disposed on the same layer as the semiconductor layers A1 and A2, the second pattern layer 212 including the same material and disposed on the same layer as the gate electrodes G1 and G2, the third pattern layer 213 including the same material and disposed on the same layer as the second electrode CE2, the fourth pattern layer 215 including the same material and disposed on the same layer as the drain electrodes D1 and D2, and a fifth pattern layer 216 including the same material as the additional wiring PL.

Although FIG. 7 shows that the pattern portion 210 includes all of the first pattern layer 211, the second pattern layer 212, the third pattern layer 213, the fourth pattern layer 215, and the fifth pattern layer 216, the exemplary embodiments are not limited thereto. The pattern portion 210 may be variously configured as a combination of one or more of the first pattern layer 211, the second pattern layer 212, the third pattern layer 213, the fourth pattern layer 215, and the fifth pattern layer 216.

In the present embodiment, the upper opening 118*h*' and the first opening 118*h* separate at least a portion of the upper organic insulating layer 118' and the organic insulating layer 118 inwardly and outwardly from the peripheral area PA so that external impurities may be prevented or reduced from penetrating through the upper opening 118*h*' and the first opening 118*h*.

In addition, the pattern portion 210 may be arranged to correspond to the upper opening 118*h*' and the first opening 118*h* and may form a step to correspond to the first opening 118*h*. Accordingly, all organic materials in the first opening 118*h*, the upper opening 118*h*', and the second opening 119*h* may be removed when the first opening 118*h*, the upper opening 118*h*', and the second opening 119*h* are formed, thereby preventing or reducing residual organic material overlapping the first opening 118*h*, the upper opening 118*h*', and the second opening 119*h*, which may cause defects.

Figure 8:
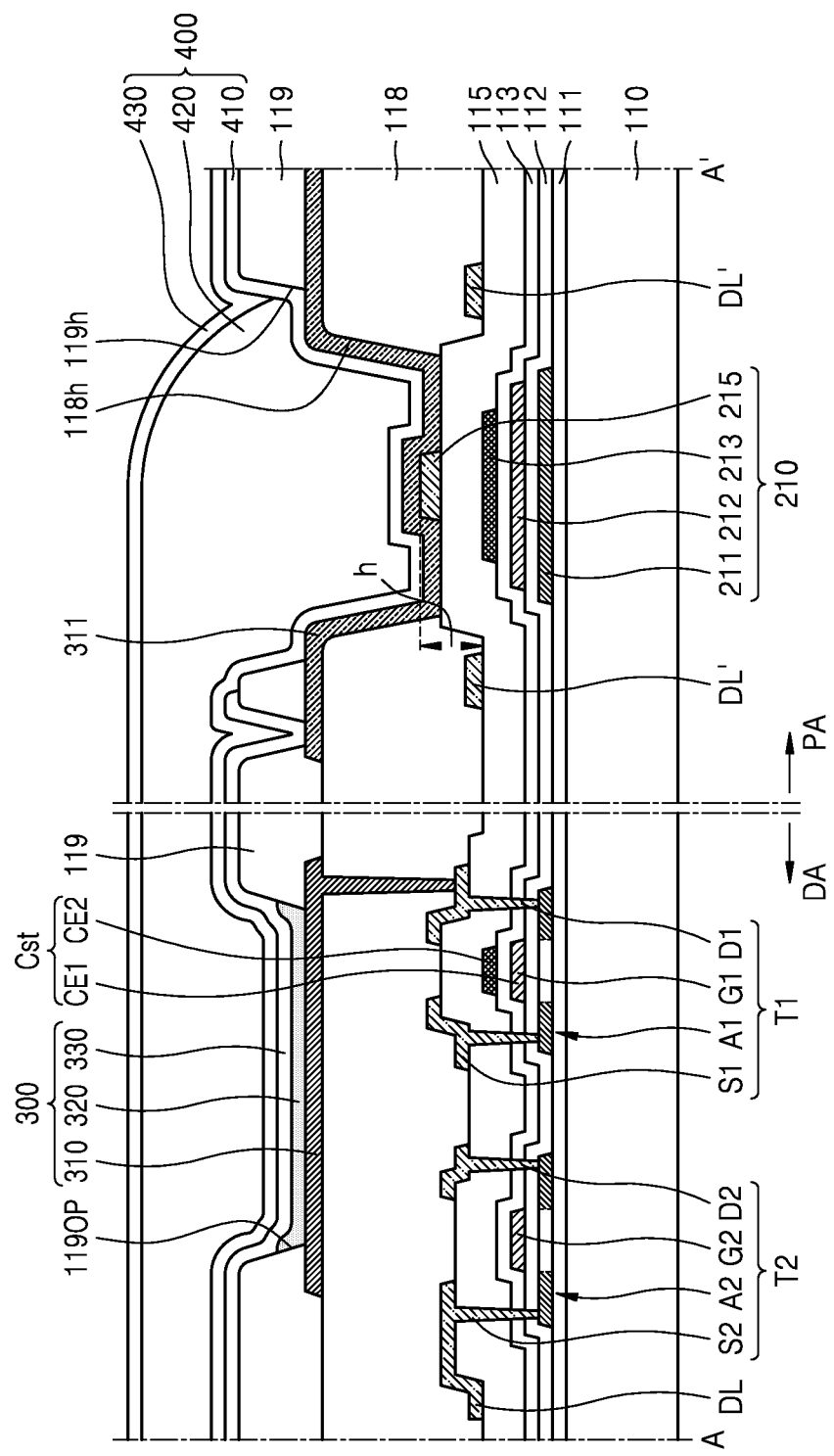
FIG. 8 is a cross-sectional view of a portion of an organic light-emitting display device according to an exemplary embodiment.

FIG. 8 is a cross-sectional view of a portion of an organic light-emitting display device according to an exemplary embodiment. In FIG. 8, the same reference numerals in FIG. 2 denote the same elements, and a duplicate description will be omitted for simplicity.

Referring to FIG. 8, the organic light-emitting display device may further include an encapsulation layer 400 sealing the display area DA. The encapsulation layer 400 may cover a display device or the like in the display area DA and protect the OLED 300 from external moisture or oxygen. The encapsulation layer 400 may cover the display area DA and partially extend to the outside of the display area DA. The encapsulation layer 400 may include a first inorganic encapsulation layer 410, an organic encapsulation layer 420, and a second inorganic encapsulation layer 430.

The first inorganic encapsulation layer 410 covers the opposite electrode 330 and may include ceramic, metal oxide, metal nitride, metal carbide, metal oxynitride, In$_2$O$_3$, tin oxide (SnO$_2$), ITO, SiO$_2$, SiNx, and/or SiON, and the like. If necessary, another layer, for example, a capping layer may be disposed between the first inorganic encapsulation layer 410 and the opposite electrode 330. The shape of the first inorganic encapsulation layer 410 is formed in accordance to the shape of a structure therebelow, and thus, as shown in FIG. 8, an upper surface thereof is not flat.

The organic encapsulation layer 420 covers the first inorganic encapsulation layer 410. However, unlike the first inorganic encapsulation layer 410, an upper surface of the organic encapsulation layer 420 may be formed to be generally flat. In more detail, the upper surface of the organic encapsulation layer 420 corresponding to the display area DA may be approximately flat. The organic encapsulation layer 420 may include at least one selected from the group consisting of acryl, metacrylic, polyester, polyethylene, polypropylene, PET, PEN, PC, PI, PES, polyoxymethylene (POM), PAR, and HMDSO.

The organic encapsulation layer 420 may flow toward an edge of the substrate 110 because of fluidity at the time of formation. In this case, a dam portion for blocking the flow of the organic encapsulation layer 420 may be formed. In the present embodiment, the organic insulating layer 118 and the bank layer 119 formed outside the first opening 118*h* may serve as such a dam portion.

The second inorganic encapsulation layer 430 covers the organic encapsulation layer 420 and may include ceramic, metal oxide, metal nitride, metal carbide, metal oxynitride, In$_2$O$_3$, SnO$_2$, ITO, SiO$_2$, SiNx, and/or SiON, and the like. As shown in the drawings, the second inorganic encapsulation layer 430 may prevent the organic encapsulation layer 420 from being exposed to the outside because the second inorganic encapsulation layer 430 contacts the edge of the first inorganic encapsulation layer 410 located outside the display area DA.

In this manner, since the encapsulation layer 400 has a multilayer structure including the first inorganic encapsulation layer 410, the organic encapsulation layer 420, and the second inorganic encapsulation layer 430, even if a crack occurs in the encapsulation layer 400, the crack may not be connected between the first inorganic encapsulation layer 410 and the organic encapsulation layer 420, or between the organic encapsulation layer 420 and the second inorganic encapsulation layer 430 through the multilayer structure. In this manner, the formation of a penetration path of external moisture or oxygen into the display area DA may be prevented or minimized.

Various functional layers such as a touch screen layer and a polarizing film may be further included on the encapsulation layer 400, and a capping layer may be further included between the opposite electrode 330 and the encapsulation layer 400.

Although FIG. 8 shows that the organic light-emitting display device is sealed by the encapsulation layer 400, the exemplary embodiments are not limited thereto. For example, the organic light-emitting display device may be sealed in such a manner that a sealing substrate facing the substrate 110 is arranged, and the substrate 110 and the sealing substrate are attached to each other with a sealing material such as frit in the peripheral area PA.

The exemplary embodiments may be embodied as separate embodiments or combined embodiments. For example, an exemplary embodiment in which the encapsulation layer 400 illustrated in FIG. 8 is arranged may be applied to the embodiments described with reference to FIGS. 2 to 7, and various combinations are possible.

According to an exemplary embodiment of the disclosure as described above, it is possible to realize an organic light-emitting display device in which deterioration of image quality is prevented or reduced during manufacture or use. However, the scope of the exemplary embodiments are not limited to the effect.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display device comprising:
    a substrate having a display area and a peripheral area outside the display area;
    a thin-film transistor disposed in the display area, the thin-film transistor comprising:
        a semiconductor active layer including a source region and a drain region disposed on the substrate;
        a gate insulating layer disposed on the semiconductor active layer;
        a gate electrode disposed on the gate insulating layer; and
        a source electrode and a drain electrode disposed on the respective source region and gate region through the gate insulating layer;
    an organic insulating layer configured to cover the thin-film transistor in the display area and comprising a first opening located in the peripheral area;

a pixel electrode electrically connected to the thin-film transistor in the display area and arranged on the organic insulating layer;

a conductive layer disposed on the organic insulating layer and in the first opening in the peripheral area, the conductive layer comprising the same material as the pixel electrode; and a pattern portion disposed between the substrate and the conductive layer, the pattern portion arranged to overlap the first opening of the organic insulating layer, wherein the pattern portion comprises:

at least one of a first pattern layer on the same layer as the semiconductor active layer and a second pattern layer on the same layer as the gate electrode and a third pattern layer on the same layer as the source electrode, the third pattern layer in direct contact with the conductive layer.

2. The organic light-emitting display device of claim 1, further comprising:

an inorganic insulating layer disposed between the at least one of the first pattern layer and the second pattern layer, and the third pattern layer, the inorganic insulating layer continuously extending to the display area.

3. The organic light-emitting display device of claim 1, further comprising an inorganic insulating layer disposed between the conductive layer and the pattern portion, the inorganic insulating layer continuously extending to the display area.

4. The organic light-emitting display device of claim 1, further comprising:

a bank layer disposed on the organic insulating layer, the bank layer extending over the display area and the peripheral area, wherein the bank layer comprises:

an opening exposing a center portion of the pixel electrode in the display area; and a second opening corresponding to the first opening in the peripheral area.

5. The organic light-emitting display device of claim 1, further comprising:

a second electrode disposed in a layer different from the gate electrode and the source electrode in the display area, wherein the pattern portion further comprises a fourth pattern layer on the same layer as the second electrode.

6. The organic light-emitting display device of claim 5, wherein the second electrode overlaps the gate electrode to form a storage capacitor.

7. The organic light-emitting display device of claim 1, further comprising:

an upper organic insulating layer disposed on the organic insulating layer; and an additional wiring disposed on the upper organic insulating layer.

8. The organic light-emitting display device of claim 7, wherein the upper organic insulating layer in the peripheral area defines an upper opening exposing the first opening of the organic insulating layer.

9. The organic light-emitting display device of claim 1, further comprising:

an intermediate layer comprising an organic emission layer disposed on the pixel electrode; and an opposite electrode disposed on the intermediate layer, wherein the conductive layer is electrically connected to the opposite electrode.

10. The organic light-emitting display device of claim 1, further comprising:

an encapsulation layer disposed on the display area, wherein the encapsulation layer comprises a first inorganic encapsulation layer, an organic encapsulation layer, and a second inorganic encapsulation layer that are sequentially stacked.

11. An organic light-emitting display device comprising:

a substrate having a display area and a peripheral area outside the display area;

a thin-film transistor disposed in the display area, the thin-film transistor comprising:

a semiconductor active layer including a source region and a drain region disposed on the substrate;

a gate insulating layer disposed on the semiconductor active layer;

a gate electrode disposed on the gate insulating layer; and a source electrode and a drain electrode disposed on the respective source region and gate region through the gate insulating layer;

an organic insulating layer configured to cover the thin-film transistor in the display area and comprising a first opening located in the peripheral area; and a pattern portion disposed on the substrate to overlap the first opening of the organic insulating layer, the pattern portion comprising:

at least two of a first pattern layer, a second pattern layer, and a third pattern at least partially overlapping each other;

a fourth pattern layer on the same layer as the drain electrode; and an inorganic insulating layer disposed between at least two of the first pattern layer, the second pattern layer, and the third pattern layer over the display area and the peripheral area.

12. The organic light-emitting display device of claim 11, further comprising:

a conductive layer disposed on the organic insulating layer and in the first opening; and an upper inorganic insulating layer disposed between the conductive layer and the pattern portion over the display area and the peripheral area.

13. The organic light-emitting display device of claim 12, further comprising:

an organic light-emitting device disposed in the display area and electrically connected to the thin-film transistor, the organic light-emitting device comprising:

a pixel electrode;

an intermediate layer comprising an organic emission layer; and an opposite electrode, wherein the conductive layer comprises the same material as the pixel electrode and is electrically connected to the opposite electrode.

14. The organic light-emitting display device of claim 13, further comprising:

a bank layer disposed on the organic insulating layer over the display area and the peripheral area, wherein the bank layer comprises:

an opening exposing a center portion of the pixel electrode in the display area; and a second opening corresponding to the first opening in the peripheral area.

15. The organic light-emitting display device of claim 11, further comprising:

a storage capacitor overlapping the thin-film transistor, the storage capacitor comprising a first electrode and a second electrode, wherein the first electrode of the storage capacitor is integrally formed with the gate electrode.

16. The organic light-emitting display device of claim 15, wherein:
the first pattern layer is disposed on the same layer as the semiconductor layer,
the second pattern layer is disposed on the same layer as the gate electrode,
the third pattern layer is disposed on the same layer as the second electrode, and
the first, second, third, and fourth pattern layers are at least partially overlapping each other in the pattern portion.

17. The organic light-emitting display device of claim 16, further comprising:
a first gate insulating layer is disposed between the first pattern layer and the second pattern layer;
a second gate insulating layer is disposed between the second pattern layer and the third pattern layer; and
an interlayer insulating layer is disposed between the third pattern layer and the fourth pattern layer,
wherein the first gate insulating layer, the second gate insulating layer, and the interlayer insulating layer extend to the display area.

18. The organic light-emitting display device of claim 11, further comprising:
an upper organic insulating layer disposed on the organic insulating layer over the display area and the peripheral area,
wherein the upper organic insulating layer defines an upper opening exposing the first opening in the peripheral area.

19. The organic light-emitting display device of claim 18, further comprising:
an additional wiring disposed on the upper organic insulating layer in the display area,
wherein the pattern portion further comprises a fifth pattern layer comprising the same material as the additional wiring.

20. The organic light-emitting display device of claim 11, further comprising:
an encapsulation layer on the display area, the encapsulation layer comprising: a first inorganic encapsulation layer; an organic encapsulation layer; and a second inorganic encapsulation layer that are sequentially stacked.

* * * * *